(12) United States Patent
Xu

(10) Patent No.: US 10,388,895 B2
(45) Date of Patent: Aug. 20, 2019

(54) ORGANIC THIN FILM TRANSISTOR WITH CHARGE INJECTION LAYER AND MANUFACTURING METHOD THEREOF

(71) Applicant: Shenzhen China Star Optoelectronics Semiconductor Display Technology Co., Ltd., Shenzhen (CN)

(72) Inventor: Hongyuan Xu, Shenzhen (CN)

(73) Assignee: SHENZHEN CHINA STAR OPTOELECTONICS SEMICONDUCTOR DISPLAY TECHNOLOGY CO., LTD., Shenzhen, Guangdong (CN)

( * ) Notice: Subject to any disclaimer, the term of this patent is extended or adjusted under 35 U.S.C. 154(b) by 0 days.

(21) Appl. No.: 15/744,075

(22) PCT Filed: Dec. 14, 2017

(86) PCT No.: PCT/CN2017/116285
§ 371 (c)(1),
(2) Date: Jan. 12, 2018

(87) PCT Pub. No.: WO2019/090895
PCT Pub. Date: May 16, 2019

(65) Prior Publication Data
US 2019/0140203 A1    May 9, 2019

(30) Foreign Application Priority Data

Nov. 7, 2017 (CN) .......................... 2017 1 1087327

(51) Int. Cl.
H01L 51/05    (2006.01)
H01L 51/10    (2006.01)
H01L 51/00    (2006.01)

(52) U.S. Cl.
CPC ...... *H01L 51/0533* (2013.01); *H01L 51/0035* (2013.01); *H01L 51/0036* (2013.01);
(Continued)

(58) Field of Classification Search
CPC ........................ H01L 51/0533; H01L 51/0566
See application file for complete search history.

(56) References Cited

U.S. PATENT DOCUMENTS

2005/0181566 A1* 8/2005 Machida ........... H01L 29/66757
                                                            438/301
2006/0131561 A1* 6/2006 Hirai ....................... C23C 16/30
                                                            257/40
(Continued)

FOREIGN PATENT DOCUMENTS

CN          1992370 A       7/2007
CN        101308904 A      11/2008
(Continued)

*Primary Examiner* — Victoria K. Hall
(74) *Attorney, Agent, or Firm* — Leong C. Lei

(57) ABSTRACT

The invention provides an OTFT and manufacturing method thereof. The OTFT comprises: a substrate; a source/drain electrode layer, formed on the substrate; an organic semiconductor layer, formed on the source/drain electrode layer; an organic insulating layer, formed on the organic semiconductor layer; a charge injection layer, formed on the organic insulating layer; a gate electrode layer, formed on the charge injection layer. The invention also provides a corresponding manufacturing method. The OTFT of the invention provides a novel structure for organic thin film transistor to improve the OTFT device stability; the OTFT prepared by the manufacturing method of OTFT of the present invention improves the OTFT device stability.

7 Claims, 4 Drawing Sheets

(52) U.S. Cl.
CPC ........ *H01L 51/055* (2013.01); *H01L 51/0541* (2013.01); *H01L 51/0566* (2013.01); *H01L 51/105* (2013.01)

(56) References Cited

U.S. PATENT DOCUMENTS

| | | | |
|---|---|---|---|
| 2007/0012914 A1* | 1/2007 | Miura | H01L 51/0012 257/40 |
| 2007/0085072 A1* | 4/2007 | Masumoto | H01L 51/0003 257/40 |
| 2008/0001151 A1* | 1/2008 | Jun | H01L 29/4908 257/59 |
| 2008/0157064 A1* | 7/2008 | Tsai | H01L 51/0022 257/40 |
| 2008/0224127 A1* | 9/2008 | Marks | H01L 51/0533 257/40 |
| 2008/0315190 A1* | 12/2008 | Tsukagoshi | H01L 51/0011 257/40 |
| 2009/0095954 A1* | 4/2009 | Onoue | H01L 51/0533 257/40 |
| 2009/0267058 A1* | 10/2009 | Namdas | H01L 51/0525 257/40 |
| 2009/0278117 A1* | 11/2009 | Lim | H01L 51/0533 257/40 |
| 2010/0006826 A1* | 1/2010 | Dimmler | H01L 51/0533 257/40 |
| 2010/0025667 A1* | 2/2010 | Liu | H01L 51/0533 257/40 |
| 2011/0115034 A1* | 5/2011 | Lo | H01L 29/4908 257/410 |
| 2013/0270534 A1* | 10/2013 | Hwang | H01L 51/0533 257/40 |
| 2015/0001539 A1* | 1/2015 | Smith | B81B 3/0086 257/57 |
| 2015/0257263 A1* | 9/2015 | Sethumadhavan | H05K 1/0366 257/88 |
| 2016/0079535 A1* | 3/2016 | Jung | H01L 51/0533 257/40 |
| 2017/0025613 A1* | 1/2017 | Kanesaka | C08G 61/126 |
| 2017/0098792 A1* | 4/2017 | Kim | H01L 51/0003 |
| 2017/0149002 A1* | 5/2017 | Jung | H01L 51/0002 |
| 2018/0052136 A1* | 2/2018 | Diao | H01L 51/0562 |
| 2018/0053896 A1* | 2/2018 | Cheng | H01L 51/0516 |

FOREIGN PATENT DOCUMENTS

| | | |
|---|---|---|
| CN | 101654279 A | 2/2010 |
| CN | 207009479 U | 2/2018 |

* cited by examiner

ORGANIC THIN FILM TRANSISTOR WITH CHARGE INJECTION LAYER AND MANUFACTURING METHOD THEREOF

BACKGROUND OF THE INVENTION

1. Field of the Invention

The present invention relates to the field of transistor techniques, and in particular to an organic thin film transistor (OTFT) and manufacturing method thereof.

2. The Related Arts

The organic thin film transistor (OTFT) is a type of TFT that uses organic substance as a semiconductor material, mostly used in plastic substrates due to the characteristics of curling and low manufacturing costs, and has become the most promising next-generation flexible display of the new array substrate technology. Compared with the traditional inorganic TFT, the OTFT manufacturing method is simpler and has lower requirements on the conditions and the purity of the film forming atmosphere, so the manufacturing cost is lower. The OTFT shows excellent flexibility and is suitable for flexible display, electronic skin, flexible sensors, and so on.

The materials for the OTFT organic semiconductor (OSC) layer are mainly polymer and small molecule, and the organic insulating (OGI) layer used with the OSC layer usually uses organic materials, such as, poly 4-ethylphenol (PVP), poly vinyl alcohol (PVA), or cytop. The interface between the OSC layer and the OGI layer has a defect state. When the OTFT is subjected to the stress due to a gate voltage for a long time, the charges are often trapped at the interface, causing the device threshold voltage (Vth) to drift (shift), leading to deterioration of device performance.

FIG. 1 shows a schematic view of a conventional OTFT structure. The conventional OTFT mainly comprises a substrate 10, a source/drain electrode layer 11 formed on the substrate 10, an organic semiconductor layer 12 formed on the source/drain electrode layer 11, an organic insulating layer 13 formed on the organic semiconductor layer 12, and a gate electrode layer 14 formed on the organic insulating layer 13; the remaining layers may further comprises an organic planarization layer (not shown) formed on the gate electrode layer 14, and so on. The description is omitted here.

When the TFT stays on for a long time, the gate electrode of the gate electrode layer 14 will be in a state of negative bias voltage (such as, Vgs=−40V) for a long time. At this time, the hole trapping will occur at the interface between the organic semiconductor layer 12 and the organic insulating layer 13, making the device difficult to turn on, causing Vth to shift to the left.

FIG. 2 is a schematic diagram of Vth left drift of a conventional OTFT, and is an example of a Vth left drift of a TFT under negative bias thermal stress (NBTS). In FIG. 2, the horizontal axis represents the gate voltage Vg in volts and the vertical axis represents the drain current Id in amps. The corresponding time of the Vth curve increases from 0 second to 2000 seconds, and the Vth curve drifts to the left.

SUMMARY OF THE INVENTION

The object of the present invention is to provide a novel structure for OTFT, to solve the problem of poor stability of OTFT device.

Another object of the present invention is to provide a manufacturing method of OTFT, for manufacturing a novel structure for OTFT, to solve the problem of poor stability of OTFT device.

To achieve the above object, the present invention provides an organic thin film structure (OTFT), which comprises: a substrate; a source/drain electrode layer, formed on the substrate; an organic semiconductor layer, formed on the source/drain electrode layer; an organic insulating layer, formed on the organic semiconductor layer; a charge injection layer, formed on the organic insulating layer; a gate electrode layer, formed on the charge injection layer.

According to a preferred embodiment of the present invention, the material of the source/drain electrode layer is gold, silver or indium tin oxide.

According to a preferred embodiment of the present invention, the material of the organic semiconductor layer is pentacene or poly (3-hexylthiophene).

According to a preferred embodiment of the present invention, the material of the organic insulating layer is poly (4-ethylphenol) or cytop.

According to a preferred embodiment of the present invention, the material of the charge injection layer is silica prepared by sol-gel method.

According to a preferred embodiment of the present invention, the material of the charge injection layer is prepared by mixing tetraethylorthosilicate (TEOS), ethanol, water and HCL in a mass ratio of 1:10:3.5:0.003.

According to a preferred embodiment of the present invention, the material of the gate electrode layer is gold, aluminum or copper.

The present invention also provides a manufacturing method of organic thin film transistor (OTFT), which comprises:

Step 1: forming a source/drain electrode layer on a substrate; Step 2: forming an organic semiconductor layer on the source/drain electrode layer, and then covering with an organic insulating layer; Step 3: forming a charge injection layer on the organic insulating layer; Step 4: forming a gate electrode layer on the charge injection layer.

According to a preferred embodiment of the present invention, the material of the charge injection layer is silica prepared by sol-gel method.

According to a preferred embodiment of the present invention, the material of the charge injection layer is prepared by mixing tetraethylorthosilicate (TEOS), ethanol, water and HCL in a mass ratio of 1:10:3.5:0.003.

The present invention also provides an organic thin film structure (OTFT), which comprises: a substrate; a source/drain electrode layer, formed on the substrate; an organic semiconductor layer, formed on the source/drain electrode layer; an organic insulating layer, formed on the organic semiconductor layer; a charge injection layer, formed on the organic insulating layer; a gate electrode layer, formed on the charge injection layer;

wherein the material of the source/drain electrode layer being gold, silver or indium tin oxide;

wherein the material of the organic semiconductor layer being pentacene or poly (3-hexylthiophene);

wherein the material of the organic insulating layer being poly (4-ethylphenol) or cytop;

wherein the material of the charge injection layer being silica prepared by sol-gel method.

In summary, the invention provides a novel structure for organic thin film transistor to improve the OTFT device stability; the OTFT prepared by the manufacturing method of OTFT of the present invention improves the OTFT device stability.

BRIEF DESCRIPTION OF THE DRAWINGS

To make the technical solution of the embodiments according to the present invention, a brief description of the drawings that are necessary for the illustration of the embodiments will be given as follows. Apparently, the drawings described below show only example embodiments of the present invention. In the drawings.

DETAILED DESCRIPTION OF THE PREFERRED EMBODIMENTS

Figure 1:
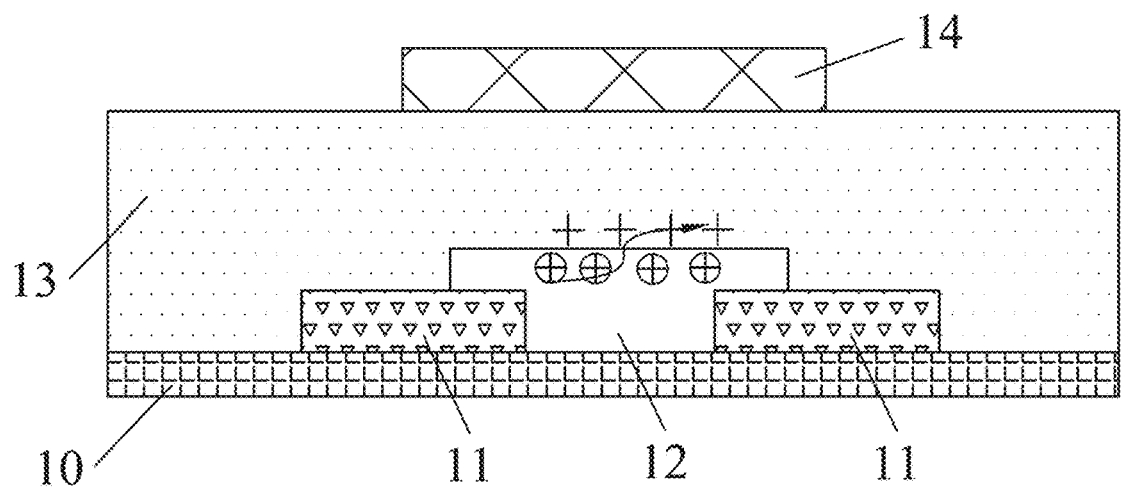
FIG. 1 is a schematic view showing a conventional OTFT.
Figure 2:
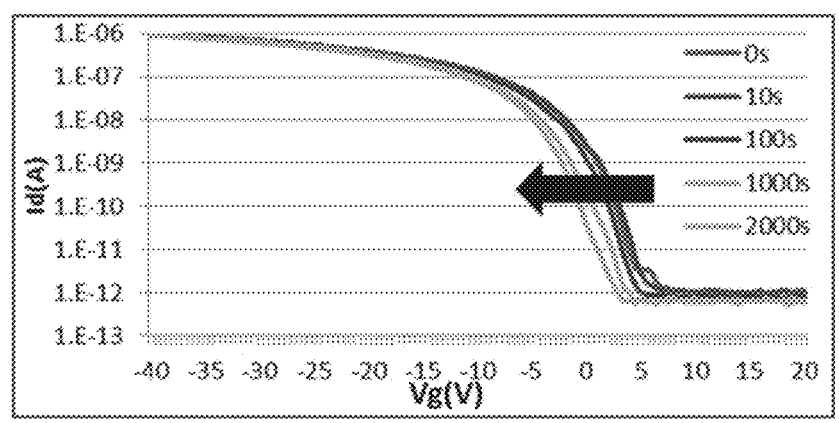
FIG. 2 is a schematic view showing the Vth left drift of a conventional OTFT.
Figure 3:
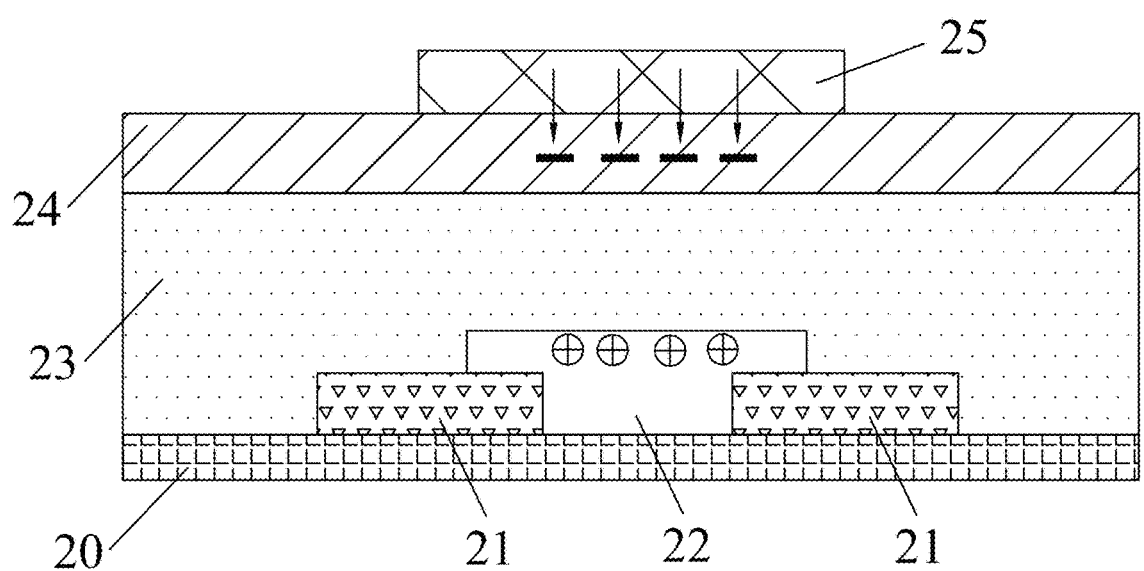
FIG. 3 is a schematic view showing the OTFT structure of a preferred embodiment of the present invention.

Referring to FIG. 3, FIG. 3 is a schematic view showing the OTFT structure of a preferred embodiment of the present invention. The OTFT of the present invention comprises: a substrate 20; a source/drain electrode layer 21, formed on the substrate 20; an organic semiconductor layer 22, formed on the source/drain electrode layer 21; an organic insulating layer 23, formed on the organic semiconductor layer 22; a charge injection layer (CIL) 24, formed on the organic insulating layer 23; a gate electrode layer 25, formed on the charge injection layer 24. The remaining structure included in the conventional OTFT will not be described here. The following only describes the structure related to the present invention.

The main feature of the present invention is to add a charge injection layer 24 between the gate electrode layer 25 and the organic insulating layer 23 so that the OTFT, when under NBTS, can trap electrons in the charge injection layer 24 to make Vth shift to right so as to compensate the Vth left shift caused by hole trapped at the interface between the organic semiconductor layer 22 and the organic insulating layer 23 to reduce the total Vth shift in the device.

Figure 4:
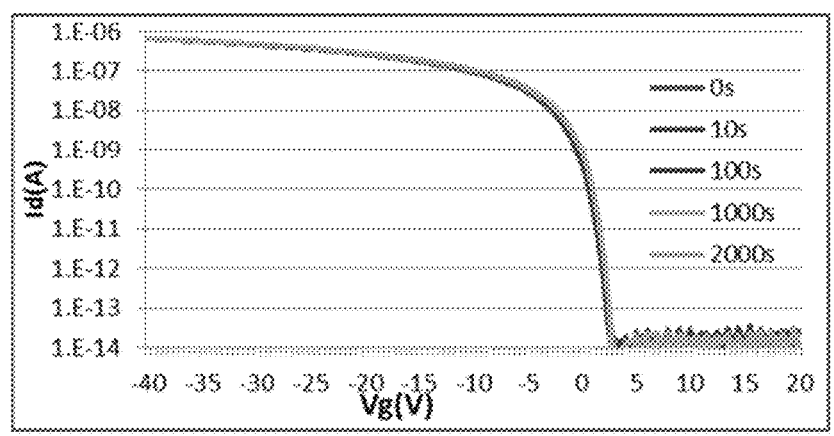
FIG. 4 is a schematic view showing the Vth left drift of the OTFT of a preferred embodiment of the present invention.

Referring to FIG. 4, FIG. 4 is a schematic view showing he Vth left drift of the OTFT of a preferred embodiment of the present invention. In FIG. 4, the horizontal axis represents the gate voltage Vg in volts and the vertical axis represents the drain current Id in amps. The corresponding time of the Vth curve increases from 0 second to 2000 seconds. By inserting the charge injection layer 24 between the gate electrode layer 25 and the organic insulating layer 23, when the gate electrode is in a negative bias voltage state (such as, Vgs=−40V) for a long time, the electrons in the gate electrode are injected into the charge injection layer under a negative bias and trapped at the interface between the gate electrode and the charge injection layer. When Vgs=0V, these electrons trapped in the charge injection layer interface will induce holes to accumulate in the organic semiconductor layer, causing the device to turn on in advance and Vth to drift to the right. At the same time, the hole trapping at the interface between the organic semiconductor layer and the organic insulating layer causes the Vth to drift to the left and the total device Vth shift decreases.

Referring to FIGS. 5-8, FIGS. 5-8 are schematic views showing a flowchart of the OTFT manufacturing method of a preferred embodiment of the present invention.

Figure 5:
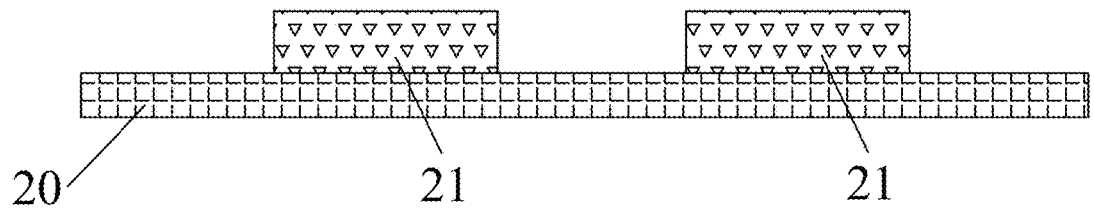
FIGS. 5-8 are schematic views showing a flowchart of the OTFT manufacturing method of a preferred embodiment of the present invention.

The manufacturing method of organic thin film transistor (OTFT) of the present invention comprises:

Step 1: forming a source/drain electrode layer 21 on a substrate 20. The source/drain electrode layer 21 corresponds to the source electrode/drain electrode of the OTFT, and the material may be conductive material with high work function, such as, gold (Au), silver (Ag) or indium tin oxide (ITO), as shown in FIG. 5.

Figure 6:
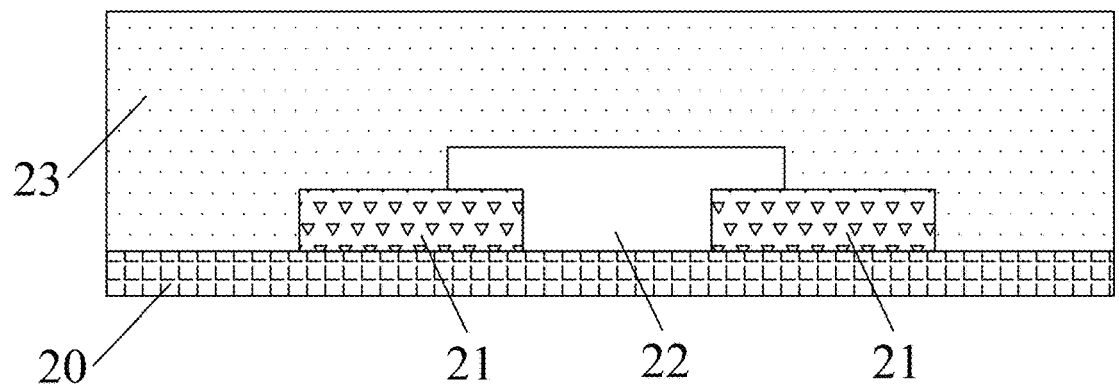

Step 2: forming an organic semiconductor layer 22 on the source/drain electrode layer 21, and then covering with an organic insulating layer 23. A patterned organic semiconductor layer material, such as, pentacene, poly (3-hexylthiophene) (P3HT), and so on, can be formed on the source/drain electrode layer 21 by vacuum evaporation or the like, and then covered with an organic insulating layer, such as, Poly (4-ethylphenol) (PVP), cytop, and so on, as shown in FIG. 6.

Figure 7:
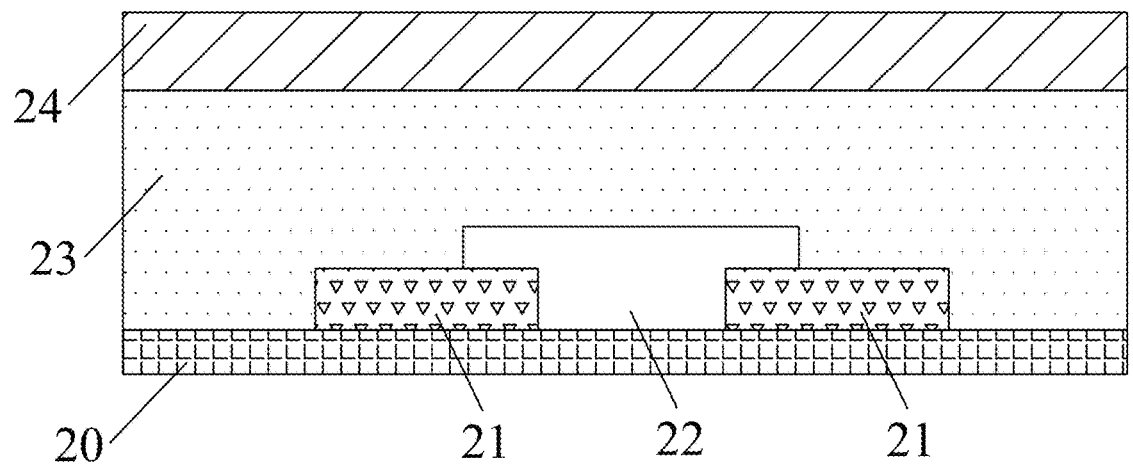
Figure 8:
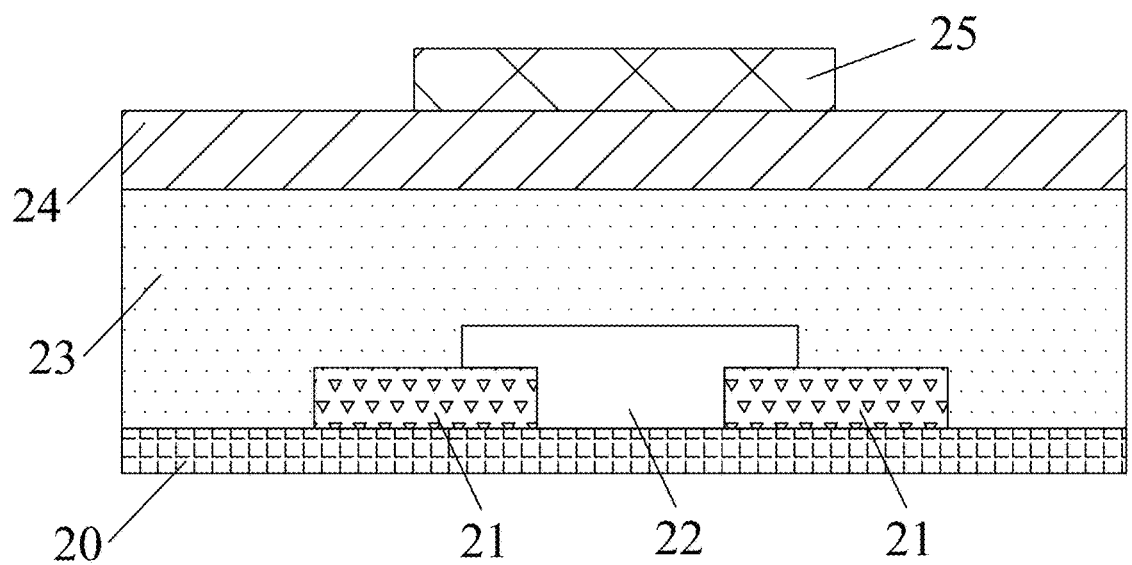

Step 3: forming a charge injection layer 24 on the organic insulating layer 23. The material of the charge injection layer 24 is silica prepared by sol-gel method. The material of the charge injection layer is prepared by mixing tetraethylorthosilicate (TEOS), ethanol, water and HCL in a mass ratio of 1:10:3.5:0.003, as shown in FIG. 7.

Step 4: forming a gate electrode layer 25 on the charge injection layer 24. The gate electrode layer 25 corresponds to forming a gate electrode, and the material can be gold (Au), aluminum (Al) or copper (Cu).

In summary, the invention provides a novel structure for organic thin film transistor to improve the OTFT device stability; the OTFT prepared by the manufacturing method of OTFT of the present invention improves the OTFT device stability.

It should be noted that in the present disclosure the terms, such as, first, second are only for distinguishing an entity or operation from another entity or operation, and does not imply any specific relation or order between the entities or operations. Also, the terms "comprises", "include", and other similar variations, do not exclude the inclusion of other non-listed elements. Without further restrictions, the expression "comprises a . . . " does not exclude other identical elements from presence besides the listed elements.

Embodiments of the present invention have been described, but not intending to impose any unduly constraint to the appended claims. Any modification of equivalent structure or equivalent process made according to the disclosure and drawings of the present invention, or any application thereof, directly or indirectly, to other related fields of technique, is considered encompassed in the scope of protection defined by the claims of the present invention.

What is claimed is:

1. An organic thin film structure (OTFT), comprising: a substrate; a source/drain electrode layer, formed on the substrate; an organic semiconductor layer, formed on the source/drain electrode layer; an organic insulating layer, formed on the organic semiconductor layer; a charge injection layer, formed on the organic insulating layer; a gate electrode layer, formed on the charge injection layer; wherein a material of the organic semiconductor layer is pentacene or poly (3-hexylthiophene); wherein a material of the charge injection layer is silica prepared by a sol-gel method; and wherein the material of the charge injection layer is prepared by mixing tetraethylorthosilicate (TEOS), ethanol, water, and HCL in a mass ratio of 1:10:3.5:0.003.

2. The organic thin film structure as claimed in claim 1, wherein a material of the source/drain electrode layer is gold, silver, or indium tin oxide.

3. The organic thin film structure as claimed in claim 1, wherein a material of the organic insulating layer is poly (4-ethylphenol) or cytop.

4. The organic thin film structure as claimed in claim 1, wherein a material of the gate electrode layer is gold, aluminum, or copper.

5. A manufacturing method of organic thin film transistor (OTFT), comprising:
   Step 1: forming a source/drain electrode layer on a substrate;
   Step 2: forming an organic semiconductor layer on the source/drain electrode layer, and then covering with an organic insulating layer;
   Step 3: forming a charge injection layer on the organic insulating layer;
   Step 4: forming a gate electrode layer on the charge injection layer;
   wherein a material of the charge injection layer is silica prepared by a sol-gel method, and the material of the charge injection layer is prepared by mixing tetraethylorthosilicate (TEOS), ethanol, water, and HCL in a mass ratio of 1:10:3.5:0.003.

6. An organic thin film structure (OTFT), comprising: a substrate; a source/drain electrode layer, formed on the substrate; an organic semiconductor layer, formed on the source/drain electrode layer; an organic insulating layer, formed on the organic semiconductor layer; a charge injection layer, formed on the organic insulating layer; a gate electrode layer, formed on the charge injection layer;
   wherein a material of the source/drain electrode layer is gold, silver, or indium tin oxide;
   wherein a material of the organic semiconductor layer is pentacene or poly (3-hexylthiophene);
   wherein a material of the organic insulating layer is poly (4-ethylphenol) or cytop;
   wherein a material of the charge injection layer is silica prepared by a sol-gel method, and the material of the charge injection layer is prepared by mixing tetraethylorthosilicate (TEOS), ethanol, water, and HCL in a mass ratio of 1:10:3.5:0.003.

7. The organic thin film structure as claimed in claim 6, wherein a material of the gate electrode layer is gold, aluminum, or copper.

\* \* \* \* \*